United States Patent

[11] 3,622,799

[72] Inventors Robert R. Marley
San Jose;
Walter C. Seelbach, Los Altos, both of Calif.
[21] Appl. No. 29,967
[22] Filed Apr. 20, 1970
[45] Patented Nov. 23, 1971
[73] Assignee Fairchild Camera and Instrument Corporation
Mountain View, Calif.

[54] TEMPERATURE-COMPENSATED CURRENT-MODE CIRCUIT
14 Claims, 3 Drawing Figs.

[52] U.S. Cl. .......... 307/215,
307/214, 307/218, 307/297, 307/310
[51] Int. Cl. .......... H03k19/30,
H03k 19/34
[50] Field of Search .......... 307/214,
215, 218, 237, 297, 310

[56] References Cited
UNITED STATES PATENTS
3,219,845 11/1965 Nieh .......... 307/215
3,259,761 7/1966 Narud et al. .......... 307/297 X

*Primary Examiner*—Donald D. Forrer
*Assistant Examiner*—L. N. Anagnos
*Attorneys*—Roger S. Borovoy, Alan H. MacPherson and Charles L. Botsford

ABSTRACT: A novel current-mode logic circuit employing temperature-compensating circuitry is disclosed. In one embodiment, a novel disable circuit is incorporated to drive both the inverted and the noninverted output voltage levels to high when the logic circuit is disabled. In another embodiment of a single rail circuit, a novel network is employed to maintain the base-collector drop at the input transistor at zero to prevent the input transistor from going into saturation at very high operating temperature.

INVENTORS
ROBERT R. MARLEY
WALTER C. SEELBACH

BY Alan H. MacPherson
ATTORNEY

TEMPERATURE-COMPENSATED CURRENT-MODE CIRCUIT

BACKGROUND OF THE INVENTION

A current-mode logic switching or current steering circuit employing a novel temperature compensation network is shown and described in U.S. Pat. application, Ser. No. 841,765, entitled "Temperature Compensated Current-Mode Logic Circuit" filed on July 15, 1969, by Robert R. Marley. This current-switching circuit comprises two branches, one branch including an input transistor (or a plurality of input transistors in parallel) and a first output transistor and the other branch including a reference transistor and a second output transistor. The input circuit to the current-mode switch is connected to the base of the input transistor, the base of the reference transistor being coupled to a source of a constant reference voltage, while both branches are coupled to a suitable current source. A high state on the base of the input transistor produces a current flow in the first branch and results in no current flow in the second branch, whereas a low state on the input will result in an absence of current in the first branch and current flow in the second branch. The first output transistor circuit provides an inverted output relative to the input state and the second output transistor circuit provides a noninverted output.

Without temperature compensation, the inverted and noninverted output levels are temperature dependent over the ambient temperature range of the current-mode logic circuit. This results from the fact that the base-emitter voltage drops of the transistors in the current-mode logic circuit govern in part the output levels and these voltage drops are temperature dependent, typically in the order of 1.2 to 1.5 millivolts per degree centigrade. The above-cited patent application discloses a novel temperature-compensating network coupled between the two branches of the current-mode logic circuit which serves to compensate for variations in base-emitter voltage drops in the transistors over the operating range of the circuit to thereby provide a stabilized output at both the inverted and the noninverted output terminals. To maintain the output levels stable, a novel temperature-independent current source is provided for this current-switching circuit.

In this prior form of current-mode logic circuit, with the input voltage level either high or low, the noninverted output is high or low while the inverted output is low or high, respectively. It is desirable, however, that when the circuit is disabled, both the noninverted and the inverted outputs will go high simultaneously.

In certain applications of the prior current-mode logic circuit, only the noninverted output is utilized. In such instances it is not desirable to provide temperature compensation for the inverted output branch since, as the ambient temperature nears the high end of the operating range, the input transistor approaches saturation, and, with increased temperature, will saturate.

BRIEF SUMMARY OF THE PRESENT INVENTION

The principle object of the present invention is to provide novel current-mode logic switching circuits employing temperature compensation circuits with additional circuits for driving both the noninverted and inverted outputs to the high voltage level in response to a disable input signal and additional novel circuits for use with a single rail current-mode logic circuit which will maintain the collector-base voltage drop at the input transistor or transistors at zero over the operating range of the current-mode logic circuit to prevent saturation of the input transistors at the high end of the temperature range.

In one embodiment of the present invention a novel circuit including a transistor having its base connected to the input from the disable circuit and a pair of diodes is utilized to drive both the noninverted and the inverted outputs to the high voltage level during disabling of the current switch circuit.

In another embodiment a single rail current-mode logic circuit is provided which, in addition to providing temperature compensation as described in the above-cited application, incorporates a novel circuit coupled between the two branches of the current-mode circuit which operates over the full ambient temperature range to maintain the base-collector voltage drop across the input transistor at a zero value to insure that the input transistor will not reach saturation, even at the highest operating temperatures.

These and other features and advantages of the present invention will become apparent from a perusal of the following specification in connection with the attached drawings.

DESCRIPTION OF THE PREFERRED EMBODIMENTS OF THE INVENTION

Figure 1:
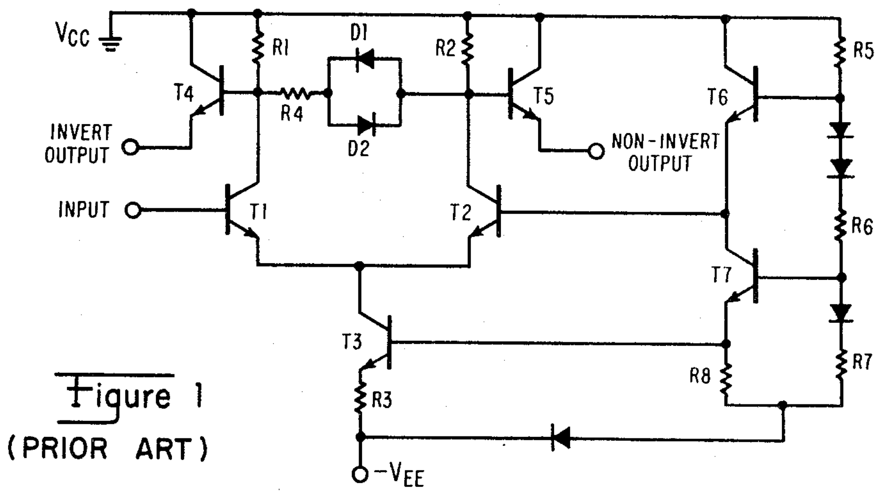
Figure 1 (PRIOR ART)
FIG. 1 is a circuit diagram of the current-mode logic circuit including the temperature-compensation network and the current source supply circuit disclosed and claimed in the above-identified patent application.

Referring now to FIG. 1, there is shown a current-mode logic switching circuit of the type described in the above-cited patent application and including the temperature-compensating network for the circuit as well as the temperature compensated current supply network. This circuit includes an input transistor T1 and a biasing resistor R1 in a first branch of the logic current and a reference transistor T2 and associated biasing resistor R2 in the second branch of the circuit, the emitters of the two transistors T1 and T2 being connected in common to a current source circuit including transistors T3 and resistor R3 coupled to the supply voltage $V_{EE}$ which may, for example, be −5.2 volts. Although only one input transistor T1 is shown, there may be additional input transistors in parallel providing an OR function. The collectors of the transistors T1 and T2 are coupled through the resistors R1 and R2 to the positive supply voltage $V_{cc}$, in this case ground. The base of the reference transistor T2 is coupled to a fixed reference voltage $V_{REF}$, which in the present circuit is −1.3 volts and about which the high and low level output voltages swing.

The input logic voltage is applied to the base of the input transistor T1; when the input voltage level is high, transistor T1 is turned on and current flows through this branch and the current source. The base of the output transistor T4 goes low to give a low or inverted output level from the emitter of T4. Since the voltage at the common coupled emitters of T1 and T2 is higher than $V_{REF}$ on the base of T2, T2 is turned off, and the base of the output resistor T5 goes high to give a high or noninverted output from the emitter of T5. Conversely, when the input level to the base of T1 goes low, T1 is turned off, the emitter voltage goes lower than $V_{REF}$, and transistor T2 is turned on and conducts current through the second branch and the current source. The base of T4 goes high to provide a high output from the associated emitter while the base of T5 goes low to give a low level output from the emitter of T5. This switching or current steering circuit is very fast since the transistors do not saturate in operation and one nanosecond gates can therefore be built.

The base-emitter voltage drops ($V_{BE}$) across transistors vary in a linear manner with ambient temperature; for example, the base-emitter diode drop is reduced about 1.2 to 1.5 millivolts per degree C. Therefore, as the ambient temperature of the current-mode logic circuit increases, both the low and high output voltage levels from the emitters of T4 and T5 will shift upwardly, a very undesirable characteristic resulting in voltage level mismatch between interconnected logic circuits. To maintain these voltage levels constant over the full operating temperature range, a temperature-compensating network comprising the resistor R4 and diodes D1 and D2 is incorporated between the two branches of the current-mode cell. This temperature-compensating network operates as follows: Assume that transistor T1 is off and transistor T2 is on so that the output at the emitter of T5 is low while the output at the emitter of T4 is high. The voltage at the junction of the collector of T5 and resistor R2 is $-V_L+V_{BE}$ where $V_L$ is the low level voltage output and $V_{BE}$ is the voltage drop across the base-emitter diode of T5.

Since the current in transistor T2 is flowing through resistors R1, R4 and diode D2 all in parallel with resistor R2, the voltage at the junction of R4 and D2 is $(-V_L+V_{BE})$ + the diode drop $V_{BE}$ of D2 which gives $-V_L+2V_{BE}$. The values of resistors R1, R2 and R4 are all equal and, therefore, the voltage at the junction of R1 and R4 is one-half of the voltage at the junction of R4 and D2 which gives $$\frac{-V_L+2V_{BE}}{2}=\frac{-V_L}{2}+V_{BE}$$

The voltage at the emitter T4 is therefore $$\frac{-V_L}{2}+V_{BE}-V_{BE}$$

of T4) or $-V_L/2$. Therefore, $V_H$, the high voltage level output at the inverted output terminal at the emitter of T4 is $-V_L/2$ and is independent of the base-emitter diode voltage of the transistors in the current-mode logic.

When transistor T1 is on and transistor T2 is off, the current flow through the parallel paths of R1 and R2, R4 and D1 will give the same independence from base-emitter diode drops as described above.

In order to provide a temperature-compensated low voltage level, $V_L$, it is necessary that the current source remain stable over the operating temperature range so that $V_L$ will be only a function of $-V_{EE}$. As described in the above-cited application, the current source circuit comprising transistor T3 and resistor R3 and the voltage supply circuit including the transistors T6 and T7, resistors R5 through R8 and the associated diodes provide a temperature-independent voltage supply and current source, rendering $V_L$ temperature independent. In one particular embodiment of the invention, $-V_{EE}$ is −5.2 volts, and the resistors have the following values: R1, R2 and R4 (120 ohms), R3 (170 ohms), R5 (170 ohms), R6 (0 ohms) and R7 and R8 (510 ohms).

Figure 2:
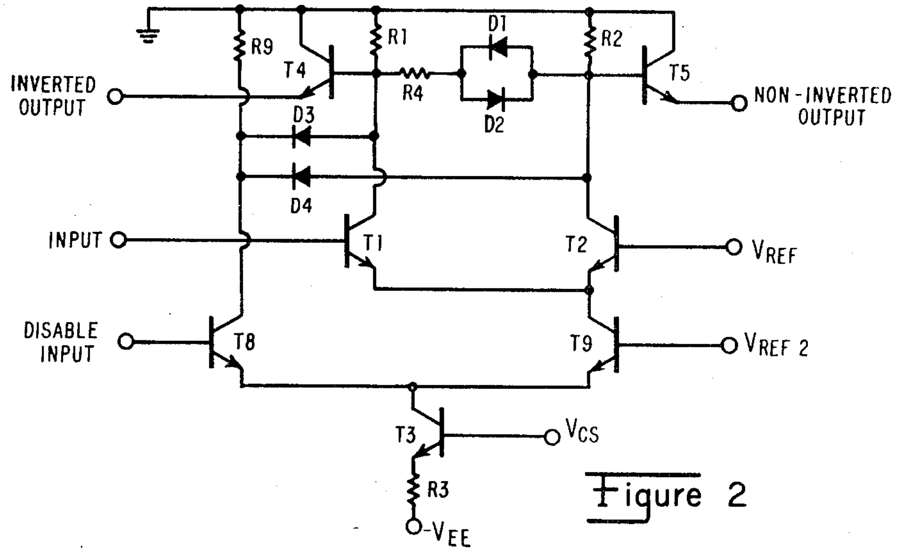
FIG. 2 is a circuit diagram of one embodiment of the present invention wherein a novel disable circuit is incorporated in the temperature-compensated current-mode logic circuit of FIG. 1.

Referring now to FIG. 2 there is shown a gate circuit of the type illustrated in FIG. 1 and including a novel disable circuit which operates to turn the gate off and have both the inverted and noninverted outputs go to the high state, $V_H$. This circuit includes a second level including disable input transistor T8 and a reference transistor T9, the base of transistor T9 being coupled to a second reference voltage $V_{REF\,2}$. The collector of transistor T8 is coupled to the two collector nodes of T1 and T2 through diodes D3 and D4, respectively, and to ground through resistor R9. The collector of T9 is coupled in common to the emitters of T1 and T2 while the emitters of both T8 and T9 are coupled in common to the current source T3, R3.

When the gate is to operate in its normal mode of operation, a low level voltage is connected to the base of input transistor 8 and transistor T8 is turned off while transistor T9 is turned on and conducts current through the current source T3, R3 and one or the other of the two branches of the gate circuit depending upon the input voltage connected to the base of transistor T1. In the normal operating mode of the circuit with T8 turned off, the two diodes D3 and D4 are back biased.

To disable this gate circuit, a high level voltage is connected to the base of T8 and T8 turns on and T9 turns off. Current now flows through transistor T8 from the three parallel circuits of R9, R1 and diode D3, and R2 and diode D4. The junctions of the resistors R1 and diode D3 and resistor R2 and diode D4 go high to the bases of T4 and T5 which both are turned on to produce a high on their emitter outputs. During the period of disable of this gate, the two high levels at the noninverted and inverted outputs are temperature independent for reasons which will be more apparent after an understanding of the circuit of FIG. 3 described below.

Figure 3:
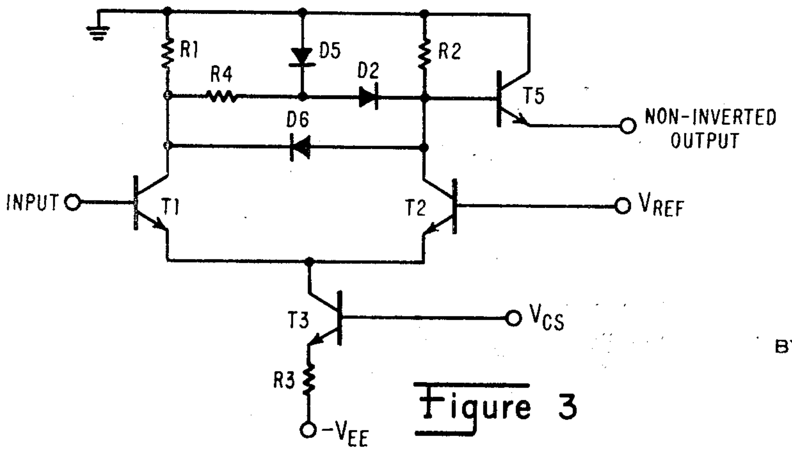
FIG. 3 is a circuit diagram of a single rail current-mode logic employing the temperature compensation network of FIG. 1 for the noninverted output and an additional novel circuit means for maintaining the base-collector voltage drop of the input transistor at zero to prevent saturation.

Referring now to FIG. 3, there is shown a single rail current mode logic gate of the type shown in FIG. 1 above in which only the noninverted output of transistor T5 is supplied. Since the inverted output is not needed, a novel circuit is employed in lieu thereof to produce a base-collector voltage drop $V_{BC}$ at the input transistor T1 which remains zero to prevent the input transistor T1 from going into saturation even at the extreme high end of the temperature range of operation of this circuit.

The gate circuit of FIG. 1 is faced with a problem in that, as the operating temperature increases at the high end of the operating range, the base-collector diode of the input transistor T1 becomes increasingly biased and, at very high temperatures, this transistor will go into saturation. On the other hand, the reference transistor T2 will remain reverse biased at its base-collector diode even at extremely high temperatures and does not become forward biased. The reason for this is as follows: To maintain a constant $V_L$ output at the emitter of transistor T5 while the base-emitter diode drop $V_{BE}$ at T5 decreases as the operating temperature increases, it is necessary that the voltage at the collector node of T2 decrease, i.e., go more negative. However, the reference voltage $V_{REF}$ applied to the base of transistor T2 is always substantially lower than the lowest voltage on the collector node of T2 and thus the base-collector diode of T2 is always reverse biased and saturation of this transistor will not occur. However, in order to maintain a stable low voltage $V_L$ at the inverted output at the emitter of transistor T4, it is necessary that the voltage at the collector node of transistor T1 decrease, i.e., go more negative, as the base- emitter voltage drop of T4 decreases with increasing operating temperature. Since the high voltage level $V_H$ is coupled to the base of T1 to result in the low voltage level $V_L$ at the emitter output of T4, the base-collector diode of T1 is forward biased and, as the temperature increases and the voltage on the collector node of T1 goes more negative, the forward biasing increases until such time as T1 goes into saturation at high operating temperatures.

In the case of a single rail operation where the inverted output is not necessary, a novel circuit such as that shown in FIG. 3 may be utilized to prevent the input transistor T1 from going into saturation even at the most extreme high operating temperatures.

The circuit of FIG. 3 omits the inverted output transistor T4, connects a diode D5 between ground and the node of resistor R4 and diode D2, and couples a diode D6 between the collector nodes of T1 and T2. With a low level on the input of the base of T1, and T1 thereby turned off and T2 turned on, the current path through the reference transistor branch flows through resistor R1, resistor R4 and diode D2, all in parallel with resistor R2. This is the identical circuit path as in the circuit shown and described with reference to FIG. 1 and thus the noninverted output at the emitter of transistor T5 is temperature independent for the same reasons given with reference to FIG. 1.

When a high level voltage input is applied to the base of T1, the current path consists of R1 in parallel with diode D5 and resistor R4 in parallel with resistor R2 and diode D6. Following the reasoning utilized in describing the temperature independence of the output of FIG. 1, the node of the resistor R2 and diode D6 is at a voltage of $-V_H+V_{BE}$, the diode drop of the base-emitter diode of T5. The voltage at the collector node of T1 is therefore $(-V_H+V_{BE})-V_{BE}$ (the voltage drop across diode D6). The two diode drops $V_{BE}$ thus cancel out to give a voltage of $-V_H$ at the collector node of T1. Since, in order to obtain the high voltage $V_H$ at the output of T5, an input voltage of $V_H$ is necessary at the input or base of T1, the base-collector voltage drop of $T_1$ is $V_H-V_H$ or zero. Thus, this base-collector diode never becomes forward biased and the input transistor T1 will never become saturated even at the most extreme high end of the temperature operating range of the system.

The similarity between the circuit of FIG. 2 and the circuit of FIG. 3 will be apparent by noting that the circuit path through T8 of FIG. 2 includes the resistor R9 in parallel with the resistor R1 and diode D3 in parallel with the resistor R2 and diode D4 whereas the current path through T1 in FIG. 3 is the resistor R1 in parallel with the resistor R4 and diode D5 in parallel with the resistor R2 and diode D6 and, in the circuits, the resistors all have equal values. Since an equipotential exists on the bases of T4 and T5, no current flows through D1, D2 and R4.

It should be noted that the compensation circuits of FIGS. 1 and 3 may use the same current source and are therefore interchangeable in the current-mode circuits. Referring to FIG. 1, assuming the current flow through the logic circuit is $I_o$ and taking the high voltage level, $V_H$, at the emitter of T5, then $$I_0=I_A+I_B$$

where $I_A$ is current through R1 and $I_B$ is the current through R2, D1, and R4

$$I_0=\frac{V_H-V_{BE}}{R2}+\frac{1}{R1}\left[\frac{(V_H-V_{BE})}{R2}(R2+R4)+V_{BE}\right]$$

$$=\left(\frac{V_H-V_{BE}}{R2}\right)\left(1+\frac{R2+R4}{R1}\right)+\frac{V_{BE}}{R1}$$

Since R1=R2=R4=R, then $$I_0=\frac{3V_H-2V_{BE}}{R}$$

Now referring to the circuit of FIG. 3, $$I_0=I_A+I_B+I_C$$

Where $I_A$ is the current through R1, $I_B$ is the current through R4 and D5, and $I_C$ is the current through R2 and D6.

Therefore, $$I_o=\frac{V_H+V_{BE}-V_{BE}}{R1}+\frac{V_H-V_{BE}}{R4}+\frac{V_H-V_{BE}}{R2}$$

And since R1=R4=R2=R $$I_o=\frac{3V_H-2V_{BE}}{R}$$

Therefore $I_0$ for the circuits of FIGS. 1 and 3 are the same and the current source utilized to supply this current may be the same. Thus the circuits may be used interchangeably in various systems using current-mode logic.

What is claimed is:

1. A current-mode logic circuit comprising a first branch circuit including an input transistor, a first collector resistor coupled to the collector thereof, and a first output transistor coupled to the first collector-resistor node, the base of said input transistor serving as the input of the current-mode logic circuit, said first output transistor providing an output voltage inverted relative to the input voltage on the base of said input transistor, a second branch circuit including a reference transistor, a second collector resistor coupled to the collector thereof and a second output transistor coupled to the second collector-resistor node, the base of said reference transistor being coupled to a reference voltage source, said second output transistor providing an output voltage, which is noninverted relative to said input voltage, said two branch circuits being coupled to a current source circuit, a temperature compensation circuit coupled between said two branch circuits comprising a resistor connected in series with a pair of parallel connected, oppositely poled PN diodes, and a disable circuit comprising a disable transistor and a second reference transistor coupled between said two branch circuits and said current source circuit, the base of said second reference transistor being coupled to a second reference voltage source, the base of said disable transistor serving as the disable voltage input to the current-mode logic circuit, and circuit means, coupled between said two branch circuits and said disable transistor, comprising a first resistor, a second circuit parallel with the first resistor including said first collector resistor and a first PN diode connected in series, and a third circuit in parallel with the first resistor and the second circuit and including said second collector resistor and a second PN diode connected in series.

2. A current-mode logic circuit as claimed in claim 1 wherein said three parallel circuits are coupled to the collector of said disable transistor, said first PN diode being coupled to said first collector-resistor node and said second PN diode being coupled to said second collector-resistor node.

3. A current-mode logic circuit as claimed in claim 2 wherein said temperature compensation circuit is connected between said first and second collector-resistor nodes.

4. A current-mode logic circuit as claimed in claim 3 wherein said current source circuit is coupled in common to the emitters of said disable and second reference transistors and wherein the collector of said reference transistor is coupled in common to the emitters of said input and said first reference transistors.

5. A current-mode logic circuit as claimed in claim 1 wherein said temperature compensation circuit is connected between said first and second collector-resistor nodes.

6. A current-mode logic circuit as claimed in claim 5 wherein said current source circuit is coupled in common to the emitters of said disable and second reference transistors and wherein the collector of said second reference transistor is coupled in common to the emitters of said input and said first reference transistors.

7. A current-mode logic circuit comprising a pair of parallel branch circuits, one branch circuit including an input transistor and a first collector resistor, the base of said input transistor being coupled to the logic level input of the current-mode circuit, the other branch circuit including a reference transistor and a second collector resistor, the base of said reference transistor being coupled to a reference voltage source, a current source coupled to both of said branch circuits, an output transistor included in said second branch circuit for providing a logic level output for the current-mode logic circuit, a temperature compensation circuit for rendering the logic level output independent of temperature change comprising a resistor and a PN diode coupled between said two branch circuits, and circuit means for providing a base-collector diode drop at said input transistor substantially zero over the operating temperature range of the logic circuit.

8. A current-mode logic circuit as claimed in claim 7 wherein said current source circuit is coupled in common to the emitters of said input and reference transistors.

9. A current-mode logic circuit as claimed in claim 7 wherein said temperature compensation circuit is connected between the collector-resistor node of said input resistor and the collector-resistor node of said reference transistor.

10. A current-mode logic circuit as claimed in claim 9 wherein said current source circuit is coupled in common to the emitters of said input and reference transistors.

11. A current-mode-logic circuit as claimed in claim 7 wherein said circuit means for providing a substantially zero base-collector voltage drop comprises said first collector-resistor in parallel with a second circuit comprising said resistor in said temperature compensation circuit in series with a second PN diode, both in parallel with a third circuit comprising said second collector-resistor in series with a third PN diode.

12. A current-mode logic circuit as claimed in claim 11 wherein said current source circuit is coupled in common to the emitters of said input and reference transistors.

13. A current-mode logic circuit as claimed in claim 11 wherein said temperature compensation circuit is connected between the collector-resistor mode of said input resistor and the collector-resistor mode of said reference transistor.

14. A current-mode logic circuit as claimed in claim 13 wherein said current source circuit is coupled in common to the emitters of said input and reference transistors.

* * * * *